Figure 1:
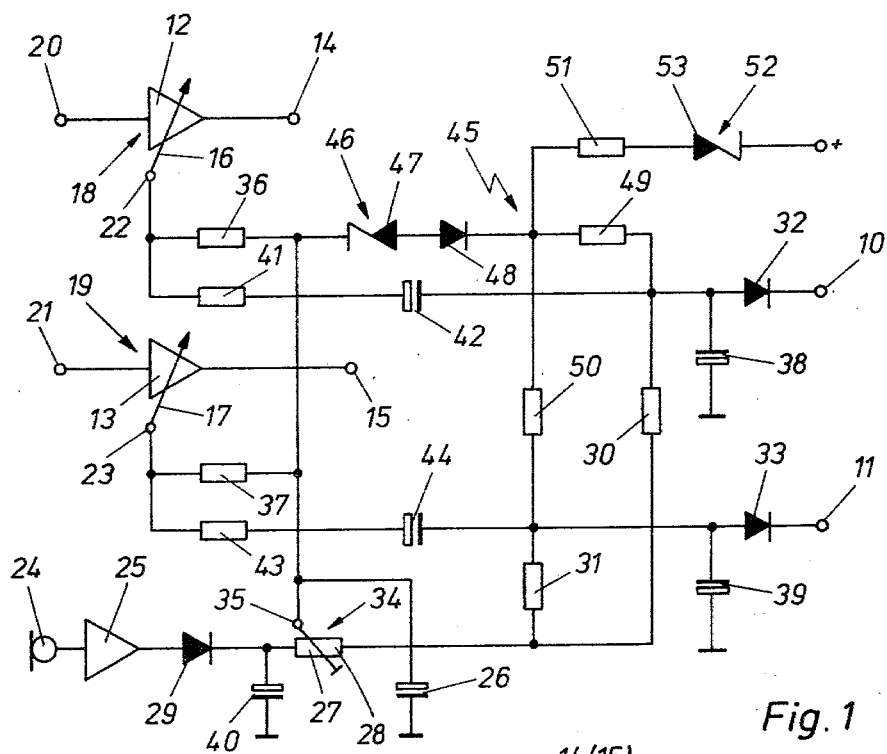

United States Patent [19]

Weidemann

[11] 4,247,955

[45] Jan. 27, 1981

[54] APPARATUS FOR MATCHING THE SOUND OUTPUT OF A RADIO RECEIVER TO THE AMBIENT NOISE LEVEL

[75] Inventor: Kurt Wiedemann, Hildesheim, Fed. Rep. of Germany

[73] Assignee: Blaupunkt-Werke GmbH, Hildesheim, Fed. Rep. of Germany

[21] Appl. No.: 114,551

[22] Filed: Jan. 23, 1980

[30] Foreign Application Priority Data

Feb. 9, 1979 [DE] Fed. Rep. of Germany ....... 2904920

[51] Int. Cl.³ .......................... H04B 1/16; H03G 3/32
[52] U.S. Cl. .................................. 455/245; 179/1 P;
179/1 VL; 330/141; 330/281; 455/246;
455/250
[58] Field of Search ................. 179/1 P, 1 VL, 1 HF;
455/234, 238, 245, 246, 250, 297, 345, 312;
330/149, 141, 278, 279, 281

[56] References Cited

U.S. PATENT DOCUMENTS

| 2,503,391 | 4/1950 | Kannenberg | 179/1 P |
| 2,564,437 | 8/1951 | Kannenberg | 179/1 P |
| 2,668,874 | 2/1954 | Augustadt | 179/1 P |
| 3,410,958 | 11/1968 | Cohen | 179/1 P |
| 3,497,622 | 2/1970 | Markin et al. | 179/1 VL |
| 3,805,177 | 4/1974 | Risley | 179/1 VL |
| 4,179,667 | 12/1979 | Böttcher | 330/141 |

OTHER PUBLICATIONS

Automatic Control of Speaker Output Compensates for Noisy Background–David B. Hoisington et al.–Nov. 20, 1972–"Electronics", pp. 118–121.

Primary Examiner—Marc E. Bookbinder
Attorney, Agent, or Firm—Frishauf, Holtz, Goodman & Woodward

[57] ABSTRACT

In a circuit which matches the speaker input signal in a car radio to the then-present noise level, an additional RC circuit is interconnected between the speaker input terminal and the input of the volume control element. Sudden increases in the speaker input voltage following a modulation pause which cause a high increase in the gain of the volume control circuit will counteract this gain, thereby preventing the excessive increase in speaker sound output following such a modulation pause which took place in the known circuits. Zener diodes to limit the voltage at the volume control elements in dependence upon the battery output voltage and to a value such that the output stage driving the speaker will not be overdriven are also provided.

19 Claims, 2 Drawing Figures

APPARATUS FOR MATCHING THE SOUND OUTPUT OF A RADIO RECEIVER TO THE AMBIENT NOISE LEVEL

The present invention relates to apparatus which automatically matches the sound output of a speaker to the ambient noise level of a radio receiver. it is particularly concerned with radio receivers in car radios. In radios having this type of apparatus, the sound output of the speaker is automatically adjusted to be several decibels (dB) higher than the ambient noise so that the listener will receive what seems to be a signal of substantially equal loudness regardless of noise level. This type of circuit greatly increases the comfort of the listener, particularly in the case of a loudspeaker in an environment where the ambient noise is subject to great changes. Use of such apparatus in a car radio, of example, obviates the need for the listener constantly to readjust the volume when such changes in ambient noise occur.

BACKGROUND AND PRIOR ART

In a known system of this type for car radios, a microphone generates a control voltage which is applied to the volume control circuit of the radio. The sound output of the speaker is thus controlled by the microphone output voltage. A further voltage derived from the speaker input is applied to the volume control circuit in a direction opposite to the microphone voltage so that the gain of the volume control circuit will be inversely proportional to the voltage at the speaker input. To state it differently, the louder the speaker sound output, the less the increase in gain of the volume control circuit. Therefore, in the known apparatus, the gain of the volume control circuit depends upon the difference between the microphone output voltage and the speaker input voltage.

This type of apparatus has been found unsatisfactory for mobile radio receivers, and, in particular, for car radios. The ambient noise in an automobile changes very rapidly and over a wide range. For example, differences in vehicle speed, differences in traffic conditions (heavily trafficked streets or quiet side streets), etc. This calls for a large control range in the system. This in turn often results in an overdriving of the output stage normally connected to the output of the volume control circuit. A distortion of the sound output of the speaker results. This is often more disturbing to the listener than a decrease of the sound output of the speaker in relation to the noise level. Further, sudden increases in the speaker output can occur following pauses in the modulation, that is intervals where the speaker input signal decreases substantially or is totally eliminated. These increases in speaker output result from the fact that the speaker input voltage which acts in phase opposition to the microphone voltage was temporarily absent and that therefore a great increase in the gain of the volume control circuit was set. The speaker output immediately following such a pause in modulation is therefore very high and is returned to a comfortable volume only after reappearance of the speaker input voltage and thus of the opposing voltage for the gain control. Such an increase in the speaker sound output is very disagreeable, particularly when there are many such modulation pauses.

THE INVENTION

It is an object of the present invention to supply apparatus for automatic matching of the speaker sound output to the ambient noise level, which does not have the above-mentioned disadvantages.

In accordance with the present invention, additional coupling means are provided which directly connect the speaker input to the volume control circuit. Preferably, this coupling circuit is an RC circuit having a very short time constant. The gain of the volume control circuit is therefore immediately affected by changes in the speaker input voltage. A sudden increase in the speaker input voltage therefore causes an immediate reduction in the gain of the volume control circuit, i.e. a reduction which takes place so rapidly that the listener is unaware of any increase in the speaker output. The apparent sound output immediately prior and immediately after a pause in the modulation are therefore approximately equal. The actual change in speaker volume output after modulation pause can be held to less than three dB, so that the listener does not detect any difference. Any abrupt changes in sound output, whether upwards or downwards, are prevented by the additional coupling circuit of the present invention.

The number of circuit components can be minimized if the microphone output voltage and the speaker input voltage are applied with opposite polarities to a capacitor, the capacitor being connected through a resistor to the volume control element which controls the gain of the volume control circuit. When more than one speaker is used in the radio, the capacitor can be connected to the anode of each of a number of diodes, the cathodes of each of which is connected to a corresponding speaker input. Preferably, a voltage limiting circuit is also added, which limits the maximum voltage applied to the volume control element and therefore the maximum output power of an output stage connected to the output of the volume control circuit. By adjusting the circuit so that the voltage limiting corresponds to the maximum allowable output of the output stage, a distortion of the speaker output is avoided. In its simplest form, the voltage limiting circuit consists of a Zener diode with associated diode and resistors.

It is also desirable to limit the allowable output of the output stage in dependence on the supply voltage for the output stage. Thus a decrease in supply voltage should result in a corresponding decrease of the output power of the output stage. The maximum gain of the volume control circuit is thus decreased with decreases in energizing voltage. This, again, prevents overdriving of the output stage when the energizing voltage for the output stage has decreased as, for example, maybe due to a decrease in the output voltage of the battery of the car.

Figure 2:
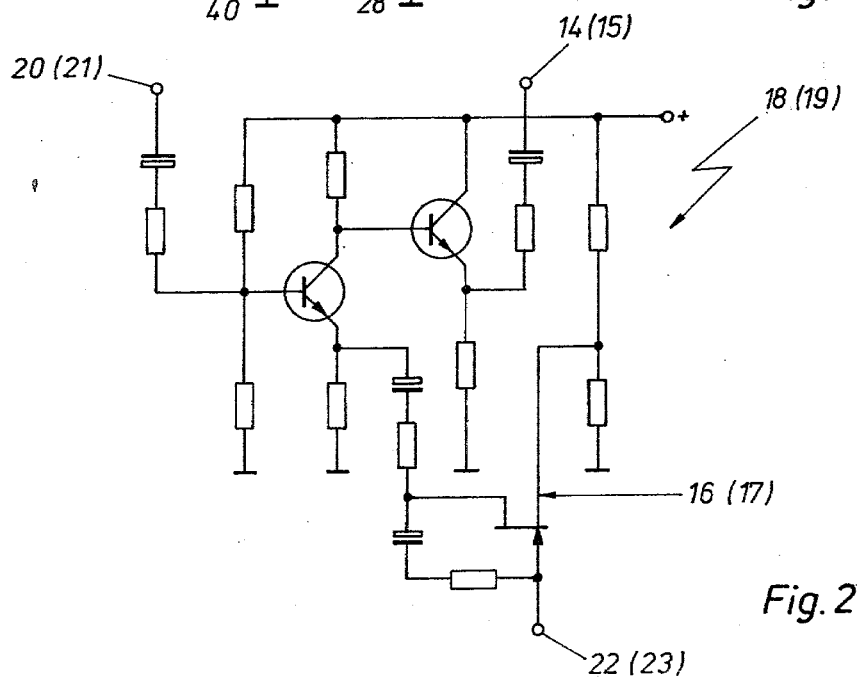

DRAWINGS DESCRIBING A PREFERRED EMBODIMENT:

FIG. 1 is a circuit diagram of a sound output matching stage for a car radio; and FIG. 2 is a circuit diagram of the volume control circuit of FIG. 1.

In FIG. 1, a circuit suitable for use in a car radio having two loudspeakers with stereo reception and reproduction is shown. Only the inputs 10 and 11 of the two speakers are shown. The circuit includes two volume control circuits 12 and 13. A first output stage is connected between output terminal 14 of volume control circuit 12 and input terminal 10 of the first speaker, while a second output stage is interconnected between output terminal 15 of volume control circuit 13 and input 11 of the second speaker. For the sake of clarity, these output stages are not shown. A volume control element 16 and 17 is associated with volume control circuits 12 and 13, respectively. These are indicated by an arrow in FIG. 1.

Volume control circuit 12 and its associated volume control element 16, as well as volume control circuit 13 and its associated volume control element 17, are constituted by integrated circuit amplifiers 18 and 19, respectively. The circuit diagram for an integrated amplifier 18 or 19 is shown in FIG. 2. The diagrams for the two amplifiers are identical, the reference numerals in parentheses referring to the second volume control circuit. The same is true in the following description.

Amplifier 18 (19) includes two DC coupled low frequency stages. Output terminal 14 (15) of the amplifier constitutes the output of the volume control circuit. The signal input of amplifier 18 (19) is denoted by reference numeral 20 (21), while its control input is designated by reference numeral 22 (23). The control input 22 (23) is the input the voltage control element 16 (17). Voltage control element 16 (17) is a field effect transistor connected as shown in FIG. 2. The construction and the operation of integrated amplifier 18 (19) are well known, so that a further description can be dispensed with. It will be noted that amplifier 18 (19) is already present in many car radios as a low frequency amplifier. A manually operable volume control is normally connected to its input 20 (21).

Referring again to FIG. 1, a microphone 24 picks up ambient noise in the interior of the automobile, as well as the sound emanating from the speaker. The microphone may be mounted within the housing of the radio or may be mounted in the vicinity thereof. It generates an output voltage which varies in dependence upon the ambient noise level and the output level of the speaker. The microphone output voltage is amplified in an amplifier 25. A difference voltage is then created from the amplified microphone output voltage and a voltage derived from speaker inputs 10 and 11. This difference voltage is applied to inputs 22 and 23 of amplifiers 18, 19. Specifically, the difference voltage is derived from a capacitor 26. Capacitor 26 is connected through a resistor 27 (peferably a variable resistor) and a diode 29 to the output of amplifier 25. It is further connected through a variable resistor 28, a resistor 30, and a diode 32 to input 10 of the first speaker and through a resistor 31 and a diode 33 to input 11 of the second speaker. The polarity of diodes 32 and 33 is such that only the negative half waves of the signal at the speaker inputs 10, 11 are allowed through. As illustrated in FIG. 1, resistors 27 and 28 preferably together constitute a potentiometer 34 whose tap 35 is connected to capacitor 26. Capacitor 26 or potentiometer tap 35 is connected through a resistor 36 to the input 22 of volume control element 16 and through a resistor 37 to the input 23 of volume control element 17. Filter capacitors 38 and 39 are connected to the anodes of diodes 32 and 33, respectively. A filter capacitor 40 is connected to the cathode of a diode 29 whose anode is connected to the output of microphone amplifier 25.

In addition, speaker input 10 is dynamically coupled to input 22 of volume control element 16, while speaker input terminal 11 is dynamically coupled to input 23 of volume control element 17. The coupling is such that an increase in voltage at speaker inputs 10 and 11 generates a voltage at inputs 22 and 23 of volume control circuits 12 and 13 which opposes the voltage across capacitor 26. Specifically, the coupling circuit for the first speaker is an RC circuit including a resistor 41 and a capacitor 42, while that for the second speaker is an RC circuit including a resistor 43 and a capacitor 44. One terminal of capacitor 42 is connected to the anode of diode 32, while one terminal of capacitor 44 is connected to the anode of diode 33. The capacitances of capacitors 42 and 44 are very small so that both RC circuits exhibit a very small time constant. (i.e.: $C42 = C44 = 4.7\mu F; R41 = R43 = 120K\omega$)

The whole circuit is energized by a source of electrical energy having one terminal indicated by a plus in FIG. 1 and another terminal connected to reference potential.

OPERATION

Microphone 24 picks up all the sound in the interior of the automobile, i.e. both the ambient noise level and the sound output of the speaker or speakers. It generates a corresponding output voltage which is amplified in amplifier 25 and then rectified. This voltage charges capacitor 26 through potentiometer 34. A voltage indicative of the speaker input voltage is derived from terminals 10 and 11. The negative half wave of the signal at the amplifier input terminal is applied to capacitor 26 and causes the capacitor to discharge in accordance with the amplitude of the speaker input voltage. The DC voltage across capacitor 26 therefore corresponds to the difference between the microphone output voltage and the speaker input voltages derived from the two speakers. The desired relationship between the microphone output voltage and the speaker input voltage can be set by varying the tap of potentiometer 34.

The DC difference voltage is applied to inputs 22 and 23 of control elements 16 and 17, respectively. The volume control circuits therefore have a corresponding gain. If, for example, the noise level increases, the ouput voltage of microphone 24 increases, the voltage across capacitor 26 increases and control elements 16 and 17 control the respective volume control circuits to increase the sound output of the speakers. Since the voltage applied to the volume control elements depends upon the speaker input voltage, the gain of the volume control circuits will also depend thereon. Specifically, the change in the gain of the volume control circuit will be less the higher the loudspeaker input voltage. In other words, the higher the present amplification of amplifiers 18 and 19, the less the increase in gain for increasing ambient noise.

If now a modulation pause occurs in the received signal, the amplitude of the signal at the speaker input terminals will be zero and therefore there will be no counter voltage to the voltage derived from microphone 24 and amplified in amplifier 25. The voltage across capacitor 26 will therefore increase rapidly. Amplifiers 18 and 19 are driven to a high gain, that is the volume control circuits are set for a high volume output of the speakers. When a speaker input voltage reappears at the end of the modulation pause, that is when the signal at terminals 10 and 11 again reaches a sufficient amplitude, a counter or opposing voltage will again be derived from these terminals. However, the rate of change with respect to time of this returning voltage results in a rapid application of voltage to volume control circuit 12 through the RC circuit including resistor 41 and capacitor 42 and from the second speaker to the second volume control circuit through the RC circuit including resistor 37 and capacitor 44. This voltage opposes the voltage across capacitor 26. The very high voltage across capacitor 26 is therefore suddenly counteracted by the voltage furnished by the RC circuit at the end of the modulation pause, that is immediately upon reappearance of a signal at terminals 10 and 11. Since the capacity of capacitors 42 and 44 is very small, an increase in speaker input voltage results in an immediate generation of the opposing voltage at the input of the volume control element. Therefore, the gain of the volume control circuits is immediately decreased and a reappearance of speaker output following a modulation pause is not accompanied by the very undesirable loud sound of the known systems. As mentioned previously, the difference in sound output between the sound immediately preceding and that immediately following a modulation pause can be held to 3 dB.

A voltage limiting circuit 45 is also provided. This voltage limiting circuit limits the input voltage to each volume control element to a predetermined maximum voltage. This predetermined maximum voltage corresponds to the maximum allowable output power of the output stage connected to terminals 14 and 15, respectively. Specifically, the voltage level is so adjusted that the output of amplifiers 18 and 19 is, at the most, the output which causes the output stage to furnish its maximum allowable output power. The voltage limiting circuit includes a threshold switch, for example a Zener diode 47. The cathode of Zener diode 47 is connected to tap 35 of potentiometer 34 and is therefore connected to terminal 22 through resistor 36 and to terminal 23 through a resistor 37. The anode of Zener diode 47 is connected through a rectifier 48 and a resistor 49 to diode 32 connected to terminal 10 and through rectifier 48, a resistor 50 and diode 33 to terminal 11, that is the input of the second speaker. Specifically, resistors 49 and 50 each have a terminal connected, respectively, to the anode of diodes 32 and 33, the cathodes of diodes 32 and 33 being connected to terminals 10 and 11, respectively. The common point of resistors 49 and 50 is connected through a resistor 51 and a Zener diode 53 to the positive terminal of the source of electrical energy. Specifically, the cathode of Zener diode 53 is connected to the positive supply terminal, while its anode is connected to resistor 51.

OPERATION

Voltage limiting circuit 45 prevents overdriving of the output stages connected in cascade with volume control circuits 12 and 13, respectively. As soon as the voltage across capacitor 26 is such that the voltage at terminals 22 and 23 exceeds the breakdown voltage of Zener diode 47, no further increase in voltage at terminals 22 and 23 can occur. The voltage at terminals 22 and 23 will remain constant in spite of any further increases of the microphone output voltage resulting from increases in the ambient noise level. Further, the maximum allowable voltage at terminals 22 and 23 is also determined by the then-present value of the supply voltage. This results from the connection to the positive supply voltage terminal through resistor 51 and Zener diode 52. If the voltage at the positive supply terminal decreases, this reduces the voltage across resistors 49 and 50. The potential at the cathode of rectifier 48 decreases and Zener diode 47 breaks down for a lower voltage level at inputs 22 and 23 of control elements 16 and 17, respectively, than was the case previously. Since the maximum output power of volume control circuits 12 and 13 decreases with reductions in supply voltage, the maximum allowable voltage level at inputs 22 and 23 of control elements 16 and 17 has been matched to the maximum allowable output power. Therefore, an overdriving of the output stage is prevented even for reduced battery output voltages in a car radio.

Various changes and modifications may be made within the scope of the inventive concepts.

I claim:

1. In a radio receiver having a speaker receiving a speaker input signal, a volume control circuit (12) associated with said speaker and having a volume control element responsive to a volume control signal applied thereto, means (24) for furnishing a noise signal indicative of the level of ambient noise surrounding said radio receiver and means (34) responsive to said noise signal and said speaker input signal for furnishing a volume control signal to said volume control element corresponding to the difference between said noise signal and said speaker input signal, the improvement comprising
   means (41, 42) coupling said volume control element to said speaker so that an increase in said speaker input signal causes a decrease in said volume control signal.

2. A radio receiver as set forth in claim 1, wherein said coupling means comprises a dynamic circuit having a very small time constant.

3. A radio receiver as set forth in claim 1, wherein said radio receiver is a car radio;
   wherein said speaker furnishes sound having a sound level corresponding to said speaker input signal amplitude;
   and wherein said means for furnishing a noise signal comprises a microphone (24) mounted to receive said ambient noise and said sound output of said speaker.

4. A radio receiver as set forth in claim 2, wherein said coupling means comprises an RC circuit (41, 42).

5. A radio receiver as set forth in claim 3, wherein said means for furnishing a volume control signal comprises a capacitor (26) first and second resistance means (27, 28) connecting said capacitor to said microphone and said speaker, respectively, and third resistance means (36) connecting said capacitor to said control element of said volume control circuit.

6. A radio receiver as set forth in claim 5, wherein said first and second resistance means together constitute a potentiometer having a tap (35) connected to said capacitor.

7. A radio receiver as set forth in claim 5, wherein said speaker has a speaker input terminal;
   further comprising a diode (32) connected to said speaker input terminal and a filter capacitor (38) connected to said diode.

8. A radio receiver as set forth in claim 1, further comprising an output stage interconnected between said volume control circuit and said speaker, said output stage having a predetermined maximum power output;
   further comprising voltage limiting means (45) connected to said volume control circuit for limiting the output voltage thereof to a predetermined maximum voltage.

9. A radio receiver as set forth in claim 8, wherein said predetermined maximum voltage is a voltage corresponding to said maximum power output of said output stage.

10. A radio receiver as set forth in claim 9, wherein said voltage limiting means comprises a threshold switch (46).

11. A radio receiver as set forth in claim 10, wherein said threshold switch is a Zener diode (47) having a cathode connected to said volume control element and an anode connected to said speaker.

12. A radio receiver as set forth in claim 11, further comprising a diode (48) and a resistor (49) connected in series thereto, and means interconnecting said diode-resistor circuit between said Eener diode and said speaker.

13. A radio receiver as set forth in claim 8, further comprising a source of electrical energy furnishing an energizing voltage; and
wherein said voltage limiting means limits said volume control signal in part in dependence upon the then-present value of said energizing voltage.

14. A radio receiver as set forth in claim 13, wherein said speaker constitutes a first speaker;
further comprising a second speaker; and
wherein said voltage limiting means is interconnected between said volume control element and said first and second speakers.

15. A radio receiver as set forth in claim 14, further comprising a first (49) and second (50) resistor connected to said first and second speaker, respectively; wherein said voltage limiting means constitutes first voltage limiting means;
furhter comprising second voltage limiting means interconnected between said first and second resistors and said source of electrical energy.

16. A radio receiver as set forth in claim 15, wherein said second voltage limiting means comprises a Zener diode.

17. A radio receiver as set forth in claim 16, wherein said Zener diode constituting said second voltage limiting means has a cathode connected to said source of electrical energy and an anode; and
wherein said second voltage limiting means further comprises a resistor interconnected between said anode of said Zener diode constituting said second voltage limiting means and said first and second resistor.

18. A radio receiver as set forth in claim 1, wherein said speaker constitutes a first speaker and said volume control circuit and volume control element constitute, respectively, a first volume control circuit and a first volume control element;
further comprising a second speaker, and a second volume control circuit having a second volume control element connected to said second speaker.

19. A radio receiver as set forth in claim 18, wherein said first and second volume control circuits and first and second volume control elements are embodied in an integrated circuit.

* * * * *